United States Patent
Okunuki et al.

(10) Patent No.: US 6,870,310 B2
(45) Date of Patent: Mar. 22, 2005

(54) MULTIBEAM GENERATING APPARATUS AND ELECTRON BEAM DRAWING APPARATUS

(75) Inventors: Masahiko Okunuki, Tokyo (JP); Hiroya Ohta, Tokyo (JP); Norio Saito, Tokyo (JP); Masaki Takakuwa, Tokyo (JP); Sayaka Tanimoto, Tokyo (JP); Takeshi Haraguchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 52 days.

(21) Appl. No.: 10/618,008

(22) Filed: Jul. 14, 2003

(65) Prior Publication Data
US 2004/0056578 A1 Mar. 25, 2004

(30) Foreign Application Priority Data
Jul. 16, 2002 (JP) ........................................ 2002-207291

(51) Int. Cl.⁷ ............................................... H01J 29/46
(52) U.S. Cl. ........................................ 313/446; 313/441
(58) Field of Search .................................. 313/414, 426, 313/432, 441, 444, 446

(56) References Cited

U.S. PATENT DOCUMENTS

| 4,684,848 A | * | 8/1987 | Kaufman et al. | ........ 315/111.81 |
| 6,225,637 B1 | | 5/2001 | Terashima et al. | ........ 250/492.2 |

* cited by examiner

*Primary Examiner*—Vip Patel
(74) *Attorney, Agent, or Firm*—Fitzpatrick, Cella, Harper and Scinto

(57) ABSTRACT

This invention provides a multielectron gun which generates a plurality of electron beams having uniform characteristics. A multielectron gun (2) is formed of a plurality of electron guns (2a–2c). The electron gun (2a) has, in addition to an electron source (21a), Wehnelt electrode (22a), and anode electrode (23), a shield electrode (24) between the Wehnelt electrode (22a) and anode electrode (23). The shield electrode reduces field interference among the electron guns.

15 Claims, 6 Drawing Sheets

US 6,870,310 B2

MULTIBEAM GENERATING APPARATUS AND ELECTRON BEAM DRAWING APPARATUS

FIELD OF THE INVENTION

The present invention relates to a multibeam generating apparatus and electron beam drawing apparatus, and is suitable for the field of manufacturing devices such as semiconductor devices.

BACKGROUND OF THE INVENTION

In recent years, a decrease in feature size of LSI patterns progresses. For example, in the field of DRAMs, a device integrating program is set forward for 256-M, 1-G, and 4-G DRAMs even after 64-M DRAMs are developed. In this situation, the exposure technique is regarded as a very significant technique in the micropatterning techniques. Particularly, the electron beam drawing technique is expected to be one of future promising exposure means as it can micropattern with a very small size of 0.1 $\mu$m or less.

A conventional electron beam drawing apparatus is a single-beam drawing scheme such as Gaussian beam scheme or variable shaped beam scheme. As this drawing scheme has a low productivity, it has been used in mask drawing, studies and development for VLSIs, and application fields for ASIC devices in small-amount production.

Recently, studies and development for the electron beam technique have progressed. From the viewpoint of productivity, a new multibeam drawing scheme which uses a plurality of electron beams to increase the drawing speed is proposed as a scheme that can be applied to the production of memory devices such as DRAMS, and is under further studies. With the multibeam drawing scheme, to obtain a throughput of 20 or more wafers/hour which is required in the production of semiconductor devices, several hundred beams or more are required. In view of this, a method of forming a multibeam by dividing one electron beam generated from one electron gun into a plurality of beams with a single electron beam column, a method of forming a plurality of beams with a multicolumn, and furthermore a method of forming a multibeam from beams of a multicolumn are proposed.

FIG. 4 shows an arrangement of a conventional typical Gaussian-scheme electron beam drawing apparatus. An electron beam drawing apparatus 1 of FIG. 4 is formed of an electron gun 2 using a three-pole-structure hot cathode, an alignment electrode 3, lenses 4 and 5, a deflector 6, a detector 7, and a stage 9 for placing a wafer 8.

FIG. 5 is a view showing a multicolumn electron beam drawing apparatus having a plurality of columns each formed of an electron gun and lens system. With the multicolumn scheme electron beam drawing apparatus having a plurality of electron guns in this manner, a high throughput can be obtained.

With the multielectron gun 2 having the multiple columns of three-pole-structure electron guns as shown in FIG. 5, to have the uniform (same) characteristics of the electron guns, e.g., brightness, beam current, crossover diameter, and angular current distribution, among the plurality of electron guns 2 (2a, 2b, and 2c), the temperatures of cathodes 21 (21a, 21b, and 21c) and the bias voltages of Wehnelt electrodes 22 (22a, 22b, and 22c) must be adjusted separately for the respective electron guns.

According to the conventional single column scheme shown in FIG. 4, the temperatures and biases as described above can be adjusted by considering only the characteristics of the electron source and Wehnelt electrode of one electron gun 2. In contrast to this, in the multielectron gun 2 shown in FIG. 5, the temperatures and biases must be adjusted separately by considering the characteristics of the electron sources and Wehnelt electrodes of the respective electron guns 2 (2a, 2b, and 2c). The characteristics of the respective electron guns, however, are difficult to set uniformly particularly because of slight differences in the shapes and surface states of the electron sources and in the shapes of the Wehnelt electrodes. Accordingly, the temperature conditions of the respective electron guns and the bias conditions of the Wehnelt electrodes must be set at different values. When the electron gun is used over a long period of time, as the cathodes wear or deform, the electron beam emitting characteristics change. Thus, the temperatures of the cathodes and the voltages of the Wehnelt electrodes must be adjusted constantly.

In this manner, in the multielectron gun having a plurality of columns of three-pole-structure electron guns, the same voltage cannot always be applied to the Wehnelt electrodes of all the electron guns. Then, field interference occurs between the columns of adjacent electron guns (between the Wehnelt electrode and anode electrode of one column and between the Wehnelt electrode and anode electrode of the adjacent column), and the uniform characteristics cannot be maintained in all the electron guns. Furthermore, when the bias voltage changes during drawing, the beam current and emission distribution characteristics of the electron beam and the shape and position (trajectory) of the crossover image fluctuate because they are adversely affected by an adjacent beam. Therefore, it is difficult to obtain a stable, highly uniform multielectron gun. Accordingly, it is also difficult to obtain an electron beam exposure apparatus in which the plurality of beams have uniform characteristics.

SUMMARY OF THE INVENTION

The present invention has been made based on the recognition of the above problems and has as its object to provide, e.g., a multibeam having uniform characteristics.

According to the first aspect of the present invention, there is provided a multibeam generating apparatus for generating a plurality of electron beams, comprising a plurality of electron generators, an acceleration electrode which forms an acceleration field for accelerating an electron emitted from each one of the plurality of electron generators, and a shield electrode at least part of which is arranged between the plurality of electron generators and the acceleration electrode. When such a shield electrode is arranged, the characteristics of the plurality of electron beams can be set uniform easily.

According to a preferred embodiment of the present invention, at least part of the shield electrode is preferably arranged between a trajectory of the electron emitted from each one of the electron generators and an electron generator near each electron generator.

According to a preferred embodiment of the present invention, each one of the electron generators comprises, e.g., a cathode electrode for emitting the electron and a Wehnelt electrode.

According to a preferred embodiment of the present invention, the shield electrode comprises, e.g., a plate-like electrode having an opening for passing the electron therethrough. A thickness of the plate-like electrode is preferably not more than 1/10 a gap between the Wehnelt electrode and the acceleration electrode. A gap between the Wehnelt electrode and the plate-like electrode is preferably smaller than a gap between the plate-like electrode and the acceleration electrode. A gap between the Wehnelt electrode and the plate-like electrode is preferably not more than ¼ a width of the Wehnelt electrode in a direction perpendicular to a trajectory of an electron beam. A potential, for a set position of the plate-like electrode, which is determined by a potential of the Wehnelt electrode and a potential of the acceleration electrode is preferably applied to the plate-like electrode.

According to a preferred embodiment of the present invention, the multibeam generating apparatus preferably comprises, outside an outermost Wehnelt electrode of an array of Wehnelt electrodes in the plurality of electron generators, an electrode for correcting characteristics of the outermost Wehnelt electrode.

According to a preferred embodiment of the present invention, the shield electrode preferably has wall portions arranged among the plurality of electron generators.

According to a preferred embodiment of the present invention, the shield electrode preferably has a plurality of cylindrical inner surfaces each surrounding a trajectory of the electron emitted from each one of the plurality of electron generators.

According to a preferred embodiment of the present invention, the acceleration electrode and/or the shield electrode is preferably provided to be common among the plurality of electron generators.

According to the second aspect of the present invention, there is provided an electron beam drawing apparatus comprising the multibeam generating apparatus described above, and a lens for projecting the plurality of electron beams generated by the multibeam generating apparatus onto a substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The preferred embodiments of the present invention will be described with reference to the accompanying drawings.

[First Embodiment]

Figure 1:
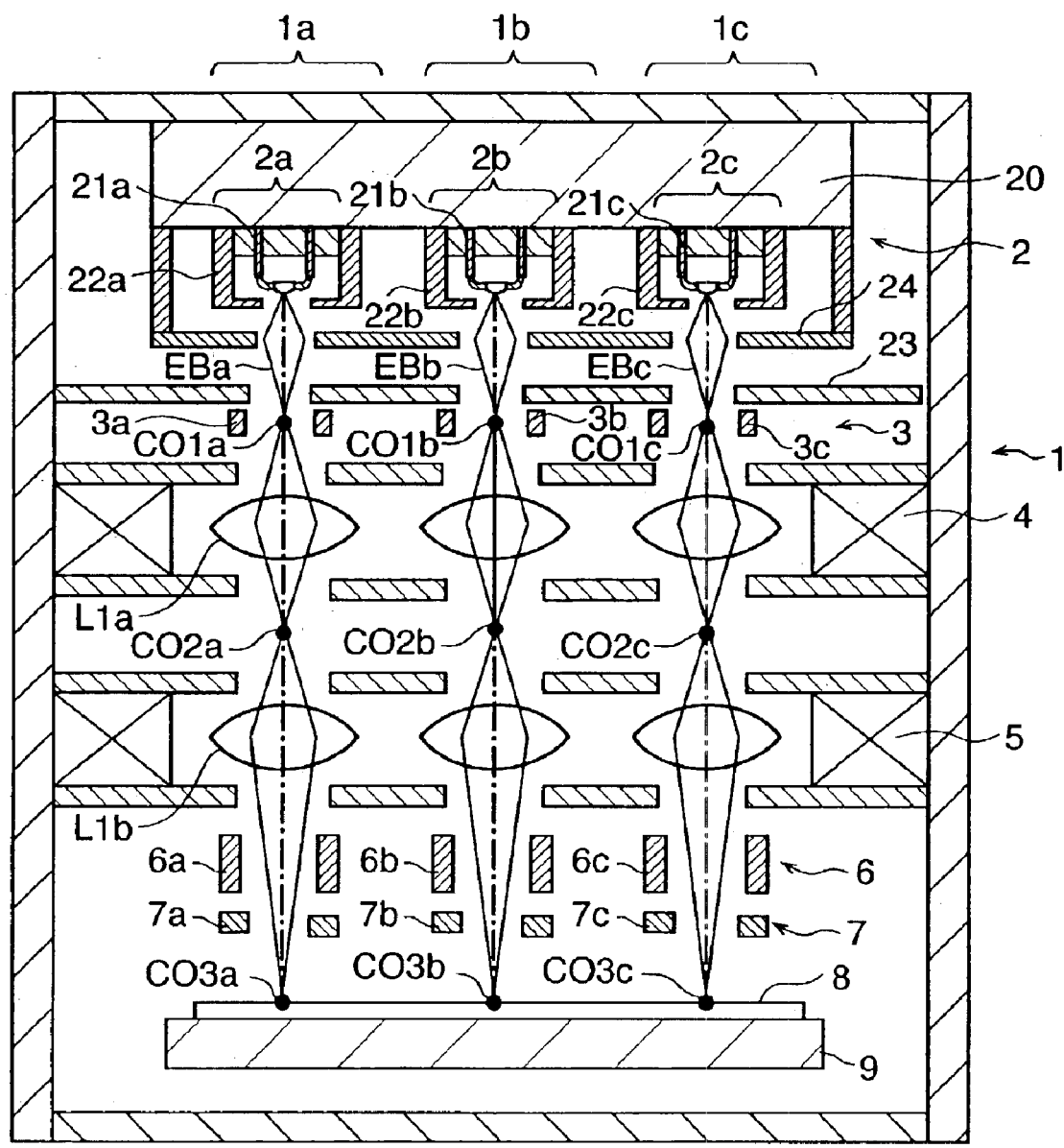
FIG. 1 is a view showing the schematic arrangement of an electron beam drawing apparatus having a multielectron gun according to a preferred embodiment of the present invention.

FIG. 1 is a view showing the schematic arrangement of an electron beam drawing apparatus according to a preferred embodiment of the present invention. An electron beam drawing apparatus 1 has a multielectron gun 2, alignment electrode 3, lenses 4 and 5, deflector 6, detector 7, and stage 9, and is formed of a plurality of columns 1a, 1b, and 1c.

The electron gun 2 is formed of a common high-voltage insulator 20 and a plurality of electron guns 2a, 2b, and 2c. The electron guns 2a, 2b, and 2c respectively have, as units that the respective types of control parameters can be adjusted independently among the columns, electron sources (e.g., a hot cathode LaB6) 21a, 21b, and 21c serving as the first electrode, and Wehnelt electrodes 22a, 22b, and 22c serving as the second electrodes. Each pair of the electron source and Wehnelt electrode forms an electron generator. The multielectron gun 2 also has, as units preferably common among the columns, an anode electrode (acceleration electrode) 23 serving as the third electrode and a shield electrode 24 as the fourth electrode.

Concerning the column 1a, an electron beam EBa emitted from the distal end of the electron source 21a of the electron gun 2a is accelerated and focused simultaneously by the acceleration field formed by the shield electrode 24 and anode electrode 23, to form a crossover image CO1a. The crossover image CO1a is further focused by a lens field L1a, formed by the lower-stage lens 4, to form a crossover image CO2a, and is projected onto a wafer 8 on the stage 9 in accordance with the action of the lens field formed by the lower-stage lens 5, thus forming the crossover image CO3a. The columns 1b and 1c have the same arrangements as that of the column 1a.

With the multicolumn electron beam drawing apparatus 1, when an electron beam is to irradiate or to be projected to a photosensitive resist applied to the wafer 8 to draw a pattern, a controller (not shown) sends signals corresponding to the drawing pattern to deflectors 6a, 6b, and 6c, so that the pattern is drawn while the respective beams are settled to predetermined settling positions. In actual drawing, the respective columns need a blanking function of turning on/off respective beams (to control whether the respective beams are to irradiate the wafer). In this embodiment, the alignment electrode 3 (3a, 3b, and 3c) realizes the blanking function.

The operation principle of the electron beam drawing apparatus 1 will be described. When electron beam exposure is to be performed with the multicolumn electron beam drawing apparatus, the beam currents and the positions and sizes of the crossover images must be uniform (identical) and the respective beam positions (trajectories) must be stable in all the columns 1a, 1b, and 1c. The electron guns 2a, 2b, and 2c are formed of the independent electron sources 21a, 21b, and 21c and the independent Wehnelt electrodes 22a, 22b, and 22c, respectively. Hence, to uniform the beam currents and the positions and sizes of the crossover images of the columns 1a, 1b, and 1c, the heat currents and Wehnelt voltages of the hot cathodes as the electron sources may be adjusted, so that the characteristics of the electron guns 2a, 2b, and 2c become uniform.

Figure 5:
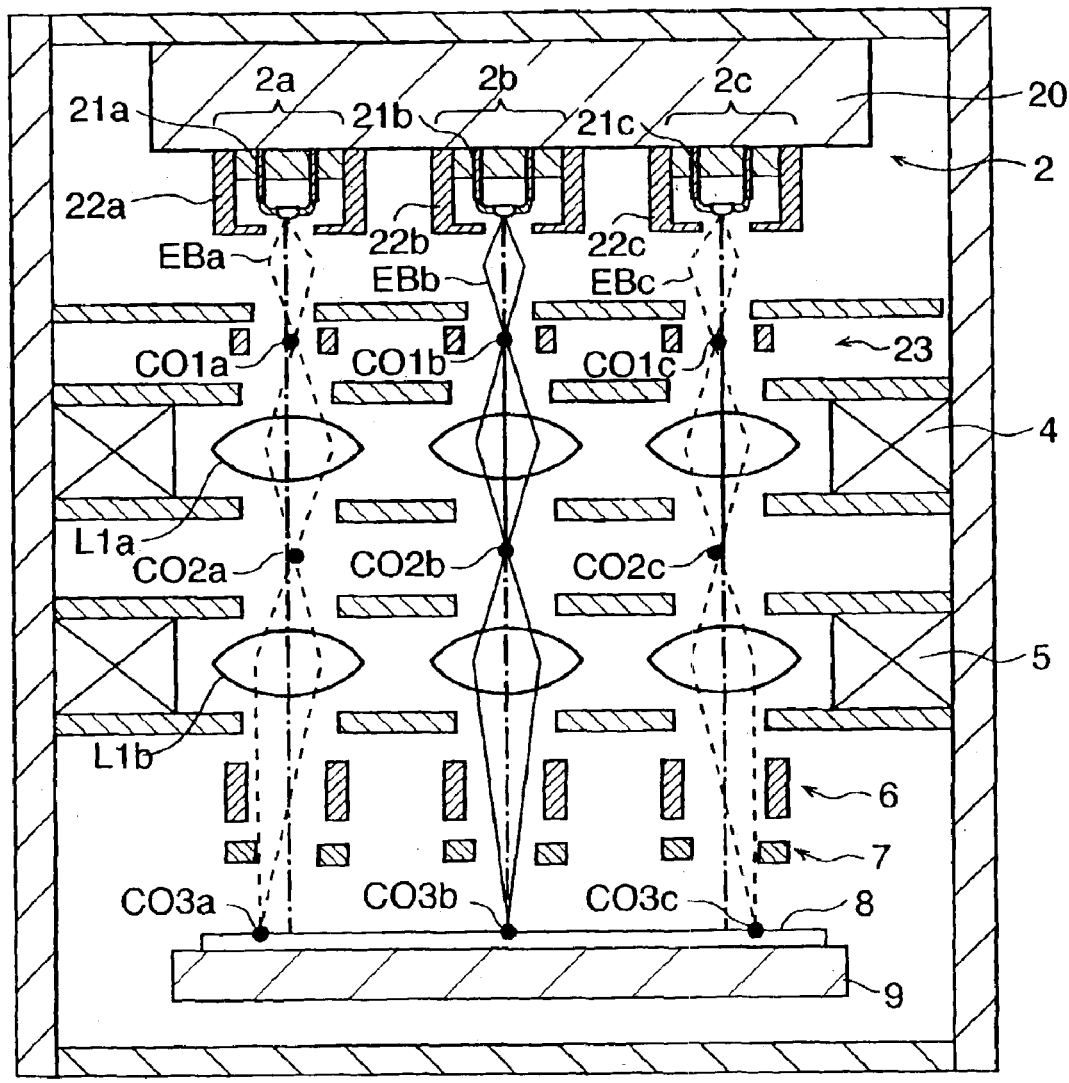
FIG. 5 is a view showing the arrangement of a conventional multicolumn electron beam drawing apparatus.

If the voltages of the Wehnelt electrodes 22a, 22b, and 22c are set at different values, between adjacent columns (e.g., the columns 1a and 1b, or 1b and 1c), the electric field between the Wehnelt electrode 22 and anode electrode 23 of one column (electron gun) is interfered with by the Wehnelt electrode 22 of the adjacent column (electron gun). Therefore, if no shield electrode 24 is provided, every time the conditions of the respective electron guns are adjusted, not only the positions of the crossover images fluctuate, as indicated by an electron beam EBa of FIG. 5, but also the angular distributions of the electron beams emitted from the hot cathodes are disturbed.

In view of this, according to this embodiment, the field interference between the adjacent columns is prevented by providing the shield electrode 24. According to this embodiment, a plurality of electron beams having uniform characteristics can be obtained easily. According to this embodiment, even when the voltages of the Wehnelt electrodes 22 (22a, 22b, and 22c) change, such change does not adversely affect the characteristics of other (adjacent or nearby) electron guns 2 (2a, 2b, and 2c). Thus, the respective electron guns can be adjusted arbitrarily. This contributes to stably obtaining a plurality of electron beams having uniform characteristics.

The shield electrode 24 can be, e.g., a plate-like electrode having an opening for passing an electron beam therethrough.

In order to prevent the various types of characteristics, e.g., the brightness, the position and size of the crossover image, and an emittance determined by the product of the diameter of the crossover image and the effective electron emitting angle, which are the characteristics of the electron gun, from being adversely affected by condition setting of the adjacent gun, the gap between the shield electrode 24 and Wehnelt electrode 22 (22a, 22b, and 22c) is preferably set to be smaller than the gap between the shield electrode 24 and anode electrode 23.

The gap between the shield electrode 24 and Wehnelt electrode 22 is preferably set to be ¼ or less the width (lateral size) of the electron gun 2 (e.g., 22a), so that interference by the side surface of the Wehnelt electrode 22 of the adjacent electron gun is suppressed.

Regarding the thickness of the shield electrode 24, in order to minimize the disturbance in acceleration field formed by the Wehnelt electrode 22 (22a, 22b, and 22c) and anode electrode 23 so that the basic characteristics of the three-pole electron gun are maintained, it is preferably set to $\frac{1}{10}$ or less the gap between the Wehnelt electrode 22 (22a, 22b, and 22c) and the anode electrode 23. For example, if the acceleration voltage is 50 kV, the gap between the Wehnelt electrode 22 (22a, 22b, and 22c) and the anode electrode 23 is typically about 10 mm. In this case, the thickness of the shield electrode 24 is preferably 1 mm or less, which is $\frac{1}{10}$ or less 10 mm.

When the potential to be applied to the shield electrode 24 is a potential, for a set position of the shield electrode 24, which is determined by the potential of the Wehnelt electrode 22 (22a, 22b, and 22c) and that of the anode electrode 23, the characteristics of the three-electrode electron gun can be maintained.

Of the plurality of Wehnelt electrodes 22, in the outermost electrode (22a and 22c in this case), field disturbance may occur due to the fringe effect. If, e.g., a dummy Wehnelt electrode having no electron source is provided outside the outermost electrode or an electrode is provided to surround the plurality of Wehnelt electrodes 22 entirely, the fringe effect can be reduced easily.

[Second Embodiment]

Figure 2:
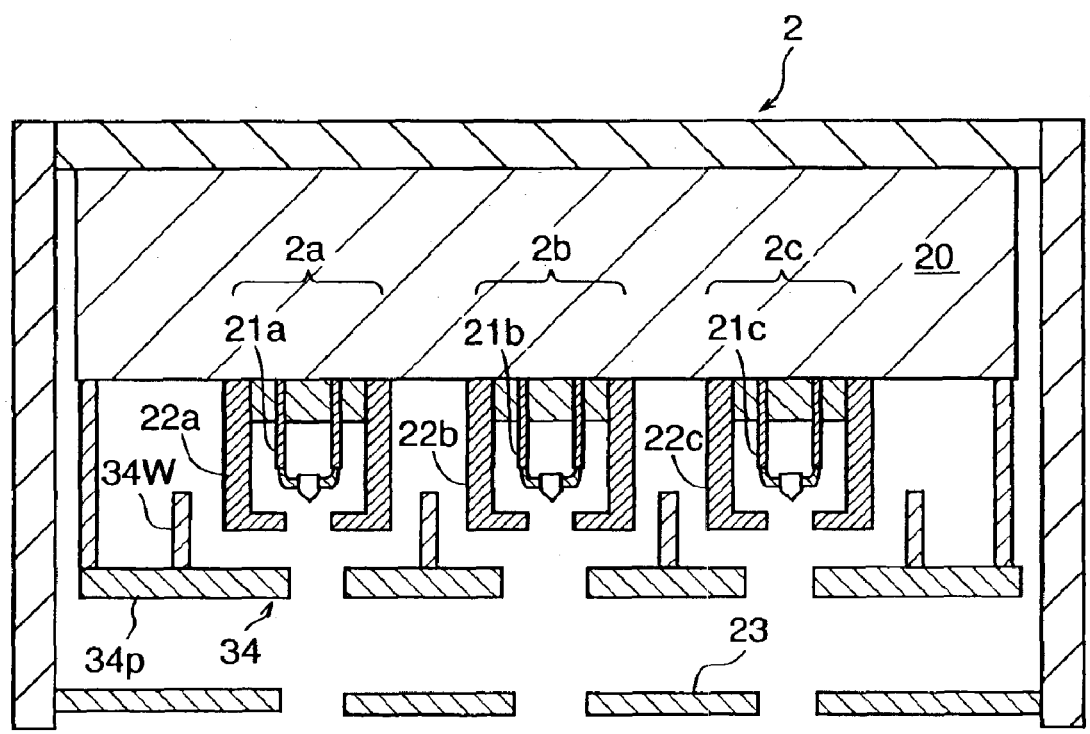
FIG. 2 is a view showing an arrangement of a multielectron gun having a reinforced countermeasure against field interference.

The second embodiment provides a technique for further reducing the field interference among columns in the multielectron gun. FIG. 2 is a view showing the structure of a multielectron gun 2 according to this embodiment. In this embodiment, a shield electrode 34 has, on its plate-like electrode member 34p, wall portions 34W projecting toward the Wehnelt electrode. The wall portions 34W surround the lower ends of Wehnelt electrodes 22a, 22b, and 22c of respective electron guns 2a, 2b, and 2c that form the multielectron gun 2, and the trajectories of the electron beams. For example, the wall portions 34W can be cylindrical. The wall portions 34W not only have the function of effectively reducing the field interference between the adjacent Wehnelt, electrodes but also the function of increasing the mechanical strength of the shield electrode 34. An increase in mechanical strength of the shield electrode 34 contributes to an increase in flatness of the shield electrode 34 and an increase in stability against a temperature change.

[Third Embodiment]

Figure 3A:
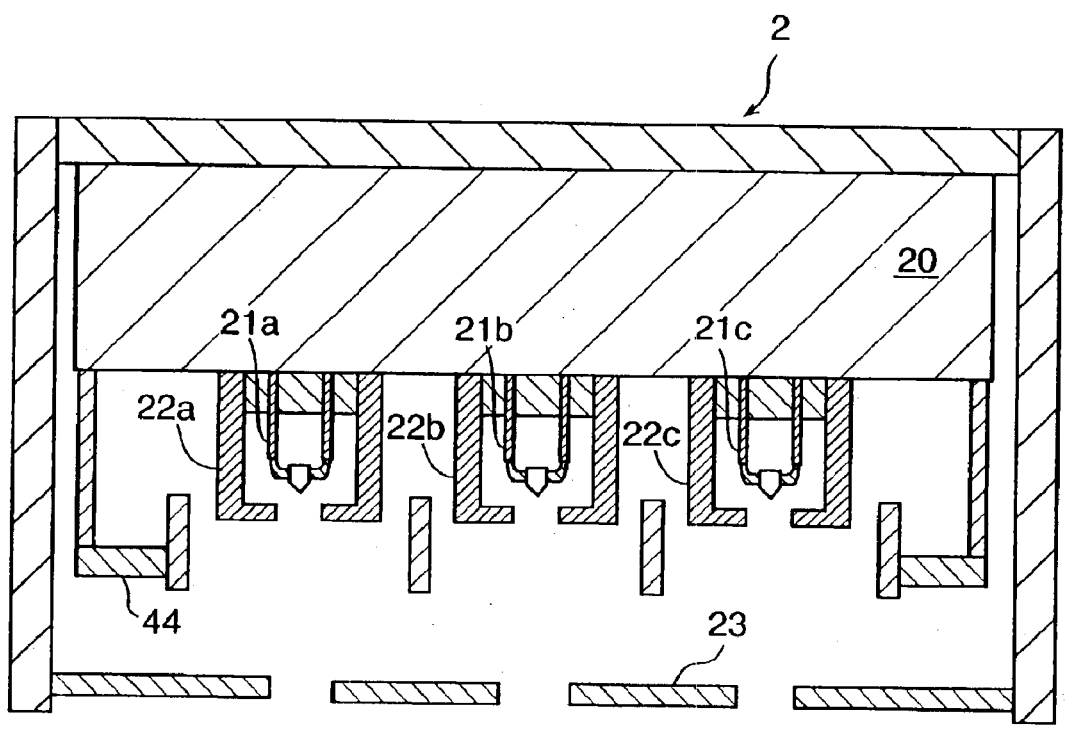
FIGS. 3A and 3B are views showing the arrangement of a multielectron gun having a field interference reducing effect and acceleration lens effect.
Figure 3B:
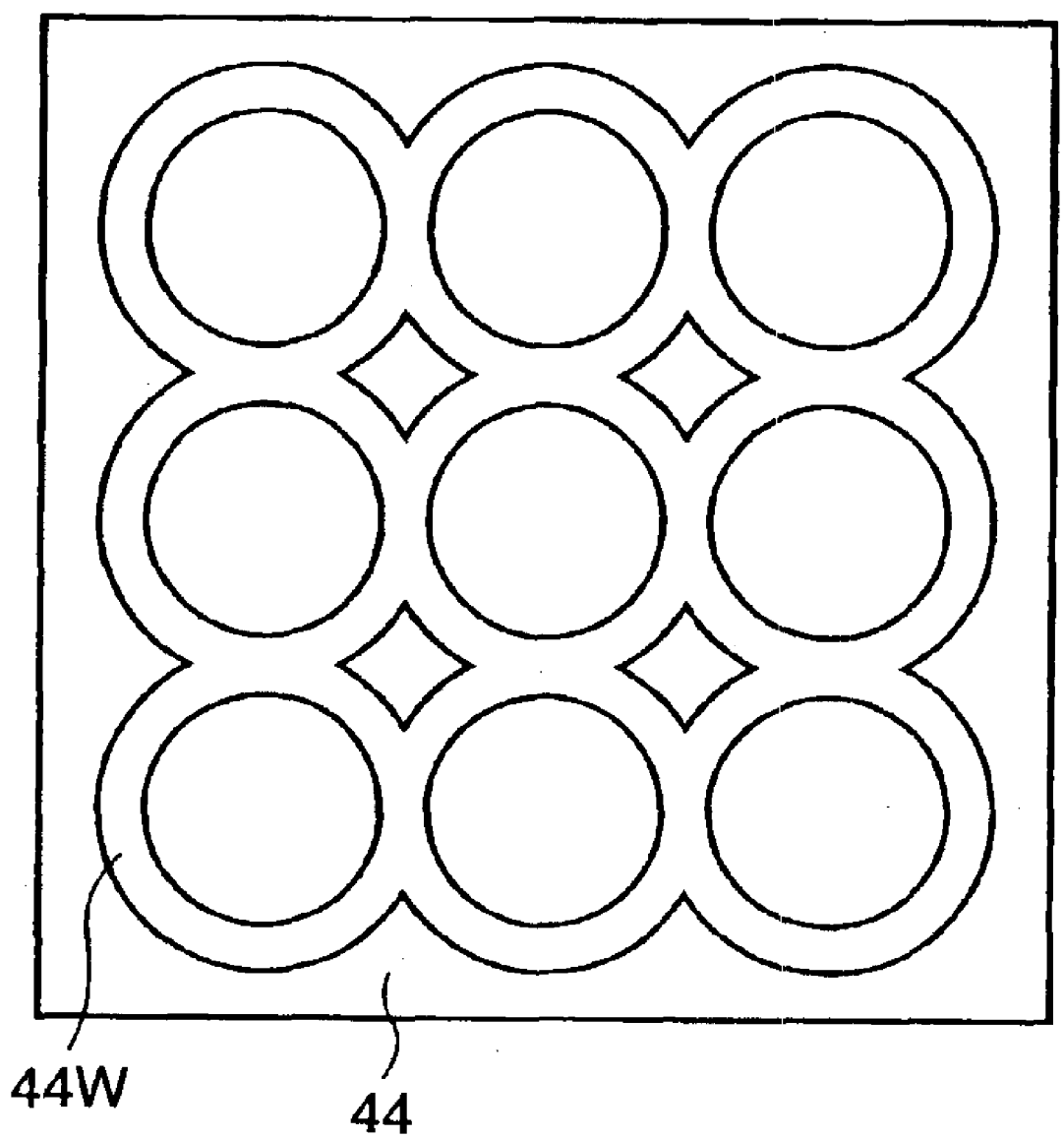
Figure 4:
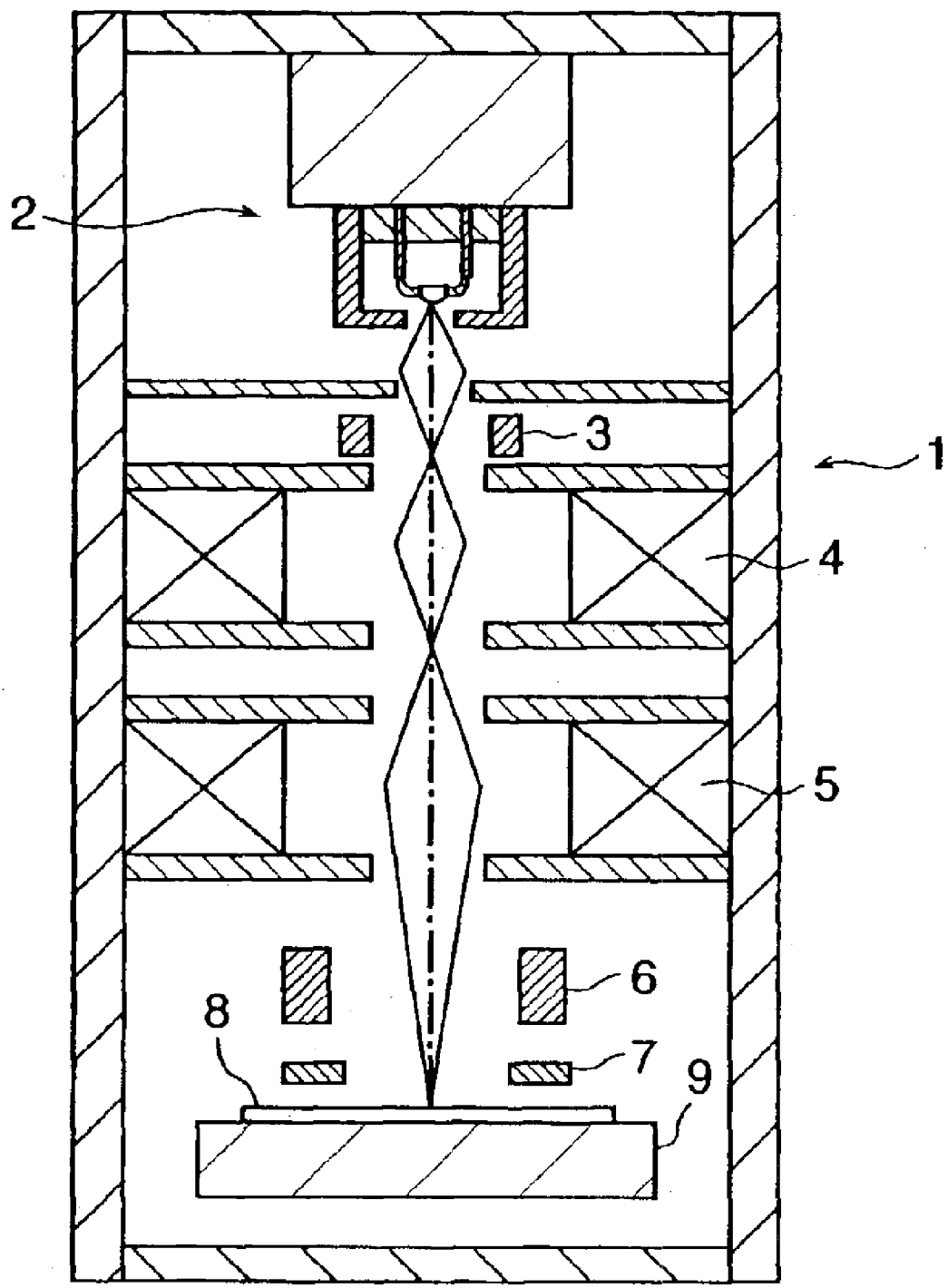
FIG. 4 is a view showing the arrangement of a conventional single-column electron beam drawing apparatus.

The third embodiment provides still another arrangement of the shield electrode. FIG. 3A is a sectional view showing the structure of a multielectron gun 2 of this embodiment, and FIG. 3B is a plan view of a shield electrode 44 shown in FIG. 3A. In the third embodiment, the shield electrode 44 is formed of the group of wall portions 44W that surround the lower ends of Wehnelt electrodes 22a, 22b, and 22c and the trajectories of electron beams. The wall portions 44W form a plurality of cylindrical inner surfaces. With this structure, the field interference between the Wehnelt electrodes of adjacent electron guns can be prevented more effectively. With this structure, the potential applied to the shield electrode 44 is not a potential determined by the position of the shield electrode 44, the potential of the Wehnelt electrode 22 (22a, 22b, and 22c), and the potential of an anode electrode 23. Rather, a field distribution formed by an electron source 21 (21a, 21b, and 21c), the Wehnelt electrode 22 (22a, 22b, and 22c), the anode electrode 23, and the shield electrode 24 can be utilized as the acceleration lens. Namely, with the shield electrode 44 having this structure, a convex lens operation and a field interference shield effect can be obtained.

As has been described above, when a structure that reduces mutual field interference among the plurality of electron guns which form the multielectron gun 2 is adopted, a multielectron gun in which the electron gun characteristics (e.g., brightness, current, and emittance) are uniform among the plurality of electron guns can be obtained. When the field interference is reduced, the respective electron guns can be adjusted to conditions with which the maximum brightness can be obtained. Thus, a multibeam type electron beam drawing apparatus with a high beam current density and productivity can be realized.

For example, the electron beam drawing apparatus in which the multielectron gun described above is incorporated enables micropatterning of 0.1 μm or less with a plurality of electron beams having uniform characteristics, and provides a high productivity.

According to the present invention, a multibeam having uniform characteristics can be obtained.

As many apparently widely different embodiments of the present invention can be made without departing from the spirit and scope thereof, it is to be understood that the invention is not limited to the specific embodiments thereof except as defined in the claims.

What is claimed is:

1. A multibeam generating apparatus for generating a plurality of electron beams, comprising:
   a plurality of electron generators;
   an acceleration electrode which forms an acceleration field for accelerating an electron emitted from each one of said plurality of electron generators; and
   a shield electrode at least part of which is arranged between said plurality of electron generators and said acceleration electrode.

2. The apparatus according to claim 1, wherein at least part of said shield electrode is arranged between a trajectory of the electron emitted from said each one of said electron generators and an electron generator near said each one of said electron generators.

3. The apparatus according to claim 1, wherein each one of said electron generators comprises
   a cathode electrode for emitting the electron and
   a Wehnelt electrode.

4. The apparatus according to claim 3, wherein said shield electrode comprises a plate-like electrode having an opening for passing the electron therethrough.

5. The apparatus according to claim 4, wherein a thickness of said plate-like electrode is not more than 1/10 a gap between said Wehnelt electrode and said acceleration electrode.

6. The apparatus according to claim 4, wherein a gap between said Wehnelt electrode and said plate-like electrode is smaller than a gap between said plate-like electrode and said acceleration electrode.

7. The apparatus according to claim 4, wherein a gap between said Wehnelt electrode and said plate-like electrode is not more than 1/4 a width of said Wehnelt electrode in a direction perpendicular to a trajectory of an electron beam.

8. The apparatus according to claim 4, wherein a potential, for a set position of said plate-like electrode, which is determined by a potential of said Wehnelt electrode and a potential of said acceleration electrode is applied to said plate-like electrode.

9. The apparatus according to claim 3, comprising, outside an outermost Wehnelt electrode of an array of Wehnelt electrodes in said plurality of electron generators, an electrode for correcting characteristics of said outermost Wehnelt electrode.

10. The apparatus according to claim 1, wherein said shield electrode has wall portions arranged among said plurality of electron generators.

11. The apparatus according to claim 1, wherein said shield electrode has a plurality of cylindrical inner surfaces each surrounding a trajectory of the electron emitted from said each one of said plurality of electron generators.

12. The apparatus according to claim 1, wherein said acceleration electrode is provided to be common among said plurality of electron generators.

13. The apparatus according to claim 1, wherein said shield electrode is provided to be common among said plurality of electron generators.

14. The apparatus according to claim 1, wherein said acceleration electrode and said shield electrode are provided to be common among said plurality of electron generators.

15. An electron beam drawing apparatus comprising:
    the multibeam generating apparatus according to claim 1; and
    a lens for projecting the plurality of electron beams generated by the multibeam generating apparatus onto a substrate.

* * * * *